(12) United States Patent
Kasumi et al.

(10) Patent No.: US 7,785,091 B2
(45) Date of Patent: Aug. 31, 2010

(54) PROCESSING APPARATUS AND DEVICE MANUFACTURING METHOD

(75) Inventors: Kazuyuki Kasumi, Utsunomiya (JP); Eigo Kawakami, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 495 days.

(21) Appl. No.: 11/755,973

(22) Filed: May 31, 2007

(65) Prior Publication Data
US 2008/0093339 A1 Apr. 24, 2008

(30) Foreign Application Priority Data
Jun. 9, 2006 (JP) ............................. 2006-160510

(51) Int. Cl.
*B28B 17/00* (2006.01)
*B29C 59/00* (2006.01)
(52) U.S. Cl. ...................................... 425/149; 425/385
(58) Field of Classification Search ................. 425/385, 425/149; 264/293
See application file for complete search history.

(56) References Cited

U.S. PATENT DOCUMENTS

| 5,993,189 A | * | 11/1999 | Mueller et al. ............ 425/405.1 |
| 6,309,580 B1 | | 10/2001 | Chou |
| 6,870,301 B2 | | 3/2005 | Choi et al. |
| 2005/0064054 A1 | * | 3/2005 | Kasumi ....................... 425/112 |

\* cited by examiner

*Primary Examiner*—Maria Veronica D Ewald
(74) *Attorney, Agent, or Firm*—Rossi, Kimms & McDowell LLP

(57) ABSTRACT

A processing apparatus configured to transfer a pattern of a mold onto a target member by pressing the mold against a resin applied to the target member includes a driver configured to move the mold and the target member relative to each other, and a controller configured to control the driver so that a changing rate of a load generated between the mold and the resin in a first state is smaller than that in a second state, and the first state being a state in which the mold that adheres to the resin starts moving in a direction separating from the resin, and the second state being a state in which the mold that moves in the direction separating from the resin is about to separate from the resin.

10 Claims, 13 Drawing Sheets

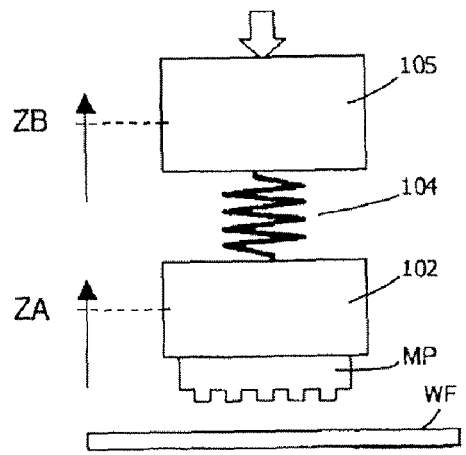
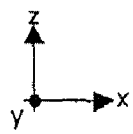
FIG. 2A
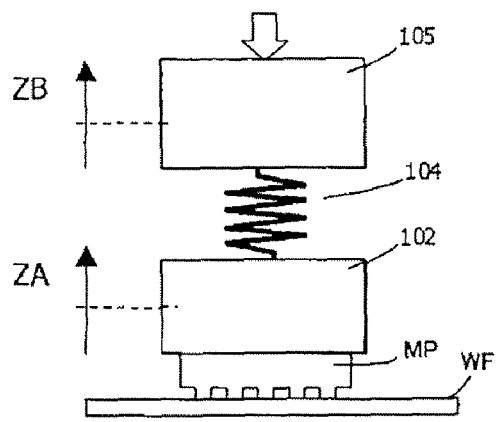 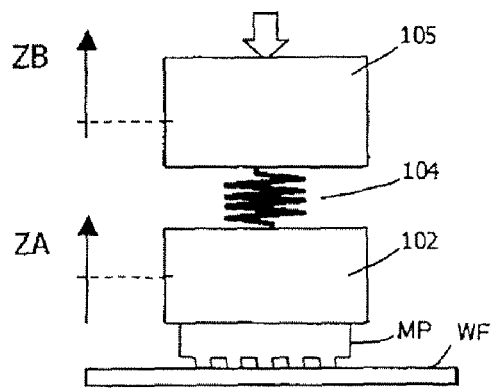
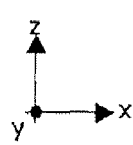
FIG. 2B   FIG. 2C

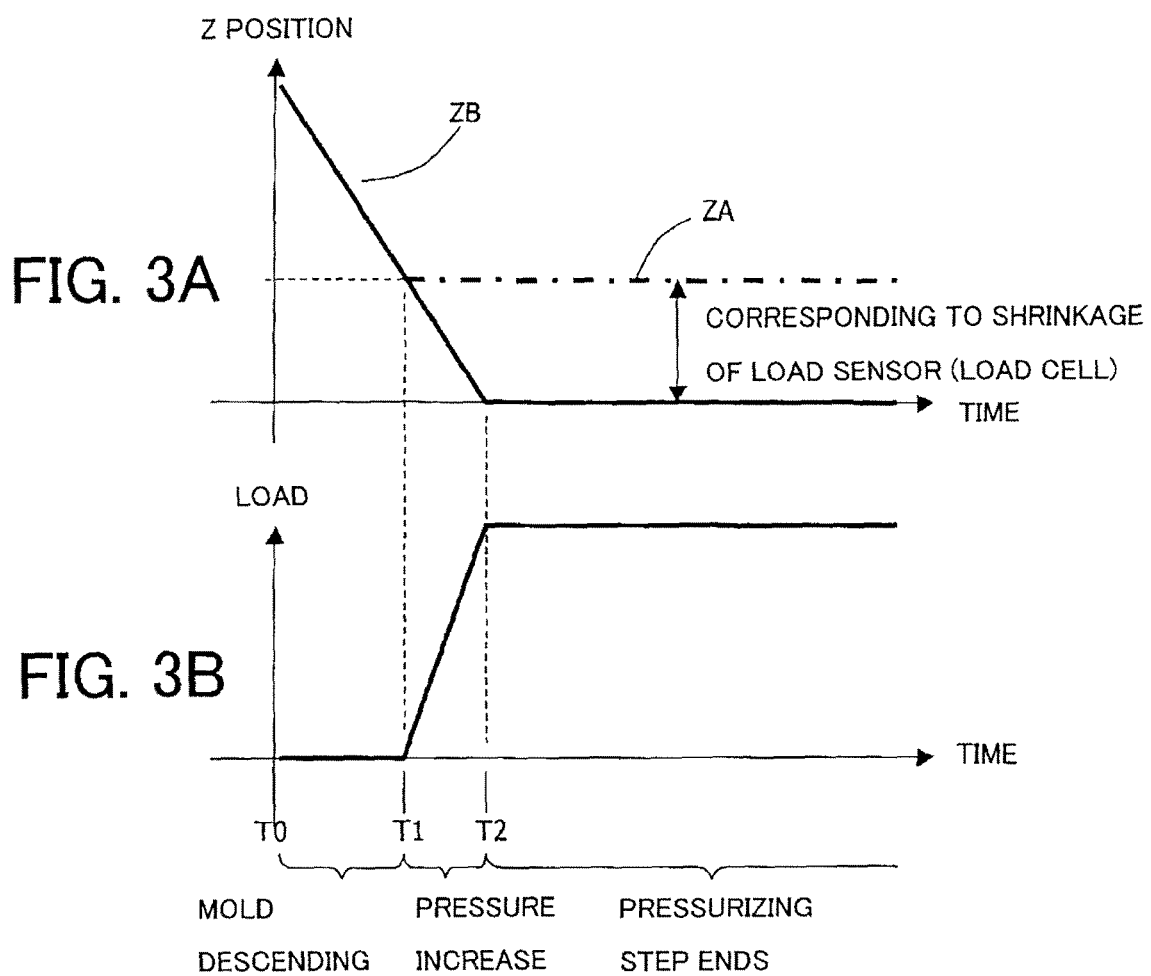

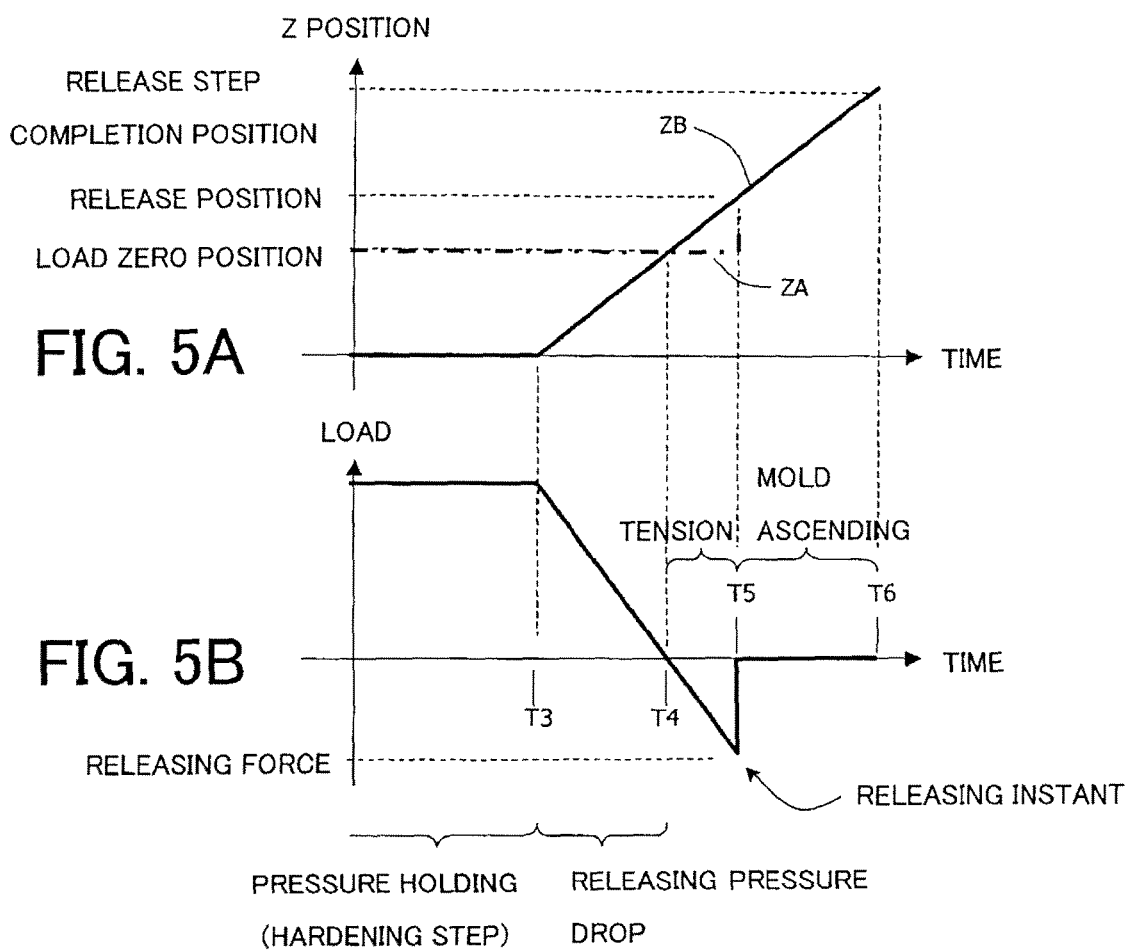

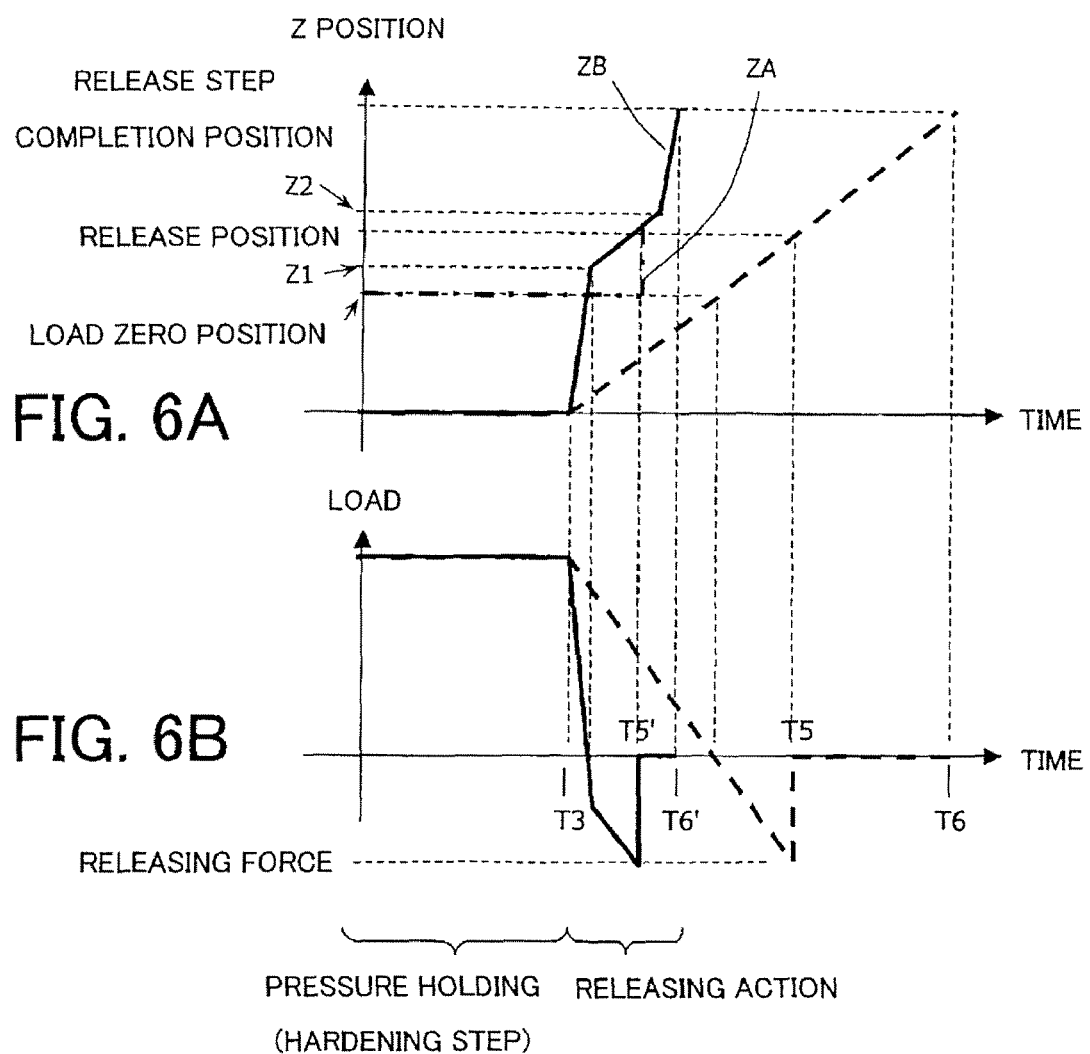

PRESSURE HOLDING (HARDENING STEP) | RELEASING ACTION

US 7,785,091 B2

PROCESSING APPARATUS AND DEVICE MANUFACTURING METHOD

BACKGROUND OF THE INVENTION

1. Field of the Invention

The present invention relates to a processing apparatus that utilizes the nanoimprint technology.

2. Description of the Related Art

A conventional projection exposure apparatus manufactures a fine structure using the lithography, such as an electronic circuit, a Micro Electro-Mechanical System ("MEMS"), and a grating lens. The projection exposure apparatus transfers and projects a reduced pattern of a mask or reticle onto a substrate, such as silicon and glass, to which a resist or photosensitive agent is applied. The projection optical system can form a very fine structure, but is too expensive to be readily available.

Accordingly, the nanoimprint calls attentions as a low cost patterning method that can form a very fine structure. The nanoimprint transfers a fine pattern to a resist by pressing a model or mold having the pattern, which is formed by an electron beam exposure, etc., against a wafer to which a resinous material or the resist is applied. The nanoimprint needs only a mold and a pressure mechanism that compresses the mold against the resinous material, and can provide fine processing inexpensively. The current nanoimprint can transfer a fine shape of about 10 nm, and have sufficiently fine processing performance. The nanoimprint is expected to apply to new devices, in particular, a fine periodic structure forming means of a magnetic recording medium, which have not been manufactured because they are unprofitable to the projection exposure apparatus.

Some transfer methods are proposed for the nanoimprint, such as a heat cycle method and a photo-curing (or UV curing) method. The heat cycle method is a method that heats a resin to be processed (or a thermoplastic material) up to a glass transition temperature or above (or enhances the resin's flowability), and pressures, cools, and then releases the mold. The photo-curing method is a method that exposes and cures the UV curing resin, while pressing the resin with a transparent mold.

The photo-curing method can comparatively easily control the temperature, and thus is suitable for the manufacture of a semiconductor device. The manufacture of the semiconductor device needs highly precise overlay accuracy, which is the accuracy necessary to overlap several patterns on the substrate. The photo-curing method allows an alignment mark on a substrate to be observed through a transparent mold, and is suitable for the manufacture of the semiconductor device from a viewpoint of the alignment. On the other hand, the heat cycle method includes the heating step, thermally expands due to the temperature rises of the substrate and the mold, and has difficulties in maintaining the overlay accuracy.

FIGS. 13A-13C are views for explaining the nanoimprint that adopts the photo-curing method. FIG. 13A shows the pressing step. FIG. 13B shows the curing step. FIG. 13C shows the releasing step. A mold MP is made of a UV transmitting material, such as quartz, is pressed against a substrate (wafer) ST to which a UV curing resin UCR is applied. The UV curing resin UCR moves along a pattern formed on the mold MP.

Ultraviolet UL is irradiated as shown in FIG. 13B while the mold MP is pressed against the substrate ST, thereby curing the UV curing resin UCR in a shape (pattern) of the mold MP. Then, the mold MP is parted, as shown in FIG. 13C, from the substrate ST. As a result, the UV curing resin UCR that maintains the shape of the mold MP remains on the substrate ST, and the pattern is transferred to the substrate ST. For a large substrate, a substrate is stepped for each pattern transfer, and the above step is repeated to sequentially transfer the pattern to the entire substrate. The transferred resin or resist pattern is equivalent to the resist pattern transferred by the projection exposure apparatus once the pattern's primary coat is removed.

In a production site used to produce a large amount of articles, which is not limited to the manufacture of a semiconductor device, the productivity of a manufacturing apparatus is also required. Even when the manufacturing apparatus is less expensive, the total production cost does not become low if the production capability is low.

Currently, a universal exposure apparatus, such as a stepper and a scanner, has a throughput of about 150 or which is the number of wafers that can be processed per unit time. The number of transfers per wafer is about 50 times (shots), and the exposure apparatus needs 1 second or below for each transfer. The nanoimprint transfer includes three steps, i.e., the pressing step, the curing step, and the releasing step. In order for the nanoimprint to realize the throughput equivalent to that of the exposure apparatus, these three steps should be completed within about one second.

Among these three steps, the curing step can be quickly completed by irradiating the UV having a high illuminance. For the pressing step, the ultrasonic vibration of the mold is proposed during pressing to lower the viscosity of the resin (resist), and to enhance the flowability, quickening the pressing step. For the releasing step, even when a mechanical action is quickened, a friction between the mold and the cured resist damages a pattern. Accordingly, one proposal performs a release facilitation process for the mold to improve its releasability. See U.S. Pat. No. 6,309,580 B1. Another proposal improves the releasability by obliquely forcing the mold or in a direction oblique to the mold's patterned plane during the release time. See U.S. Pat. No. 6,870,301 B1.

Nevertheless, the prior art cannot sufficiently satisfy the throughput required for the nanoimprint. For example, even when the release facilitation process is performed for the mold, it takes several seconds for the mold to release. The method that obliquely forces the mold during releasing can lessen damages of the pattern formed on the resist, but does not necessarily quicken the releasing step or provide the fast releasing step.

The releasing step moves the mold at a low speed, as discussed later, so that the pattern formed on the resist does not get damaged when the mold parts from the resist. In other words, the releasing step continues to move the mold at a speed at which the mold is parted from the resist or a speed that does not damage the pattern formed on the resist. The releasing step maintains constant not only the mold speed but also a load between the mold and the resist. The releasing step does not damage the pattern formed on the resist, but needs a long time.

BRIEF SUMMARY OF THE INVENTION

The present invention is directed to a processing apparatus that provides a fast releasing step and has an excellent throughput.

A processing apparatus according to one aspect of the present invention configured to transfer a pattern of a mold onto a target member by pressing the mold against a resin applied to the target member includes a driver configured to move the mold and the target member relative to each other, and a controller configured to control the driver so that a changing rate of a load generated between the mold and the resin in a first state is smaller than that in a second state, and the first state being a state in which the mold that adheres to the resin starts moving in a direction separating from the resin, and the second state being a state in which the mold that moves in the direction separating from the resin is about to separate from the resin.

Further features of the present invention will become apparent from the following description of exemplary embodiments with reference to the attached drawings.

BRIEF DESCRIPTION OF THE DRAWINGS

FIGS. 2A-2C are schematic views showing actions of a first mold driver, a load sensor, and a second mold driver in the processing apparatus shown in FIG. 1.

FIG. 3A is a graph showing the actions of the first mold driver and the second mold driver in the processing apparatus shown in FIG. 1. FIG. 3B is a graph showing a load change relative to the actions of the first mold driver and the second mold driver shown in FIG. 3A.

FIG. 5A is a graph showing conventional actions of the first mold driver and the second mold driver in the processing apparatus shown in FIG. 1. FIG. 5B is a graph showing a load sensor relative to the actions of the first mold driver and the second mold driver shown in FIG. 5A.

FIGS. 6A and 6B are views for explaining a first embodiment of the present invention.

DESCRIPTION OF THE EMBODIMENTS

Figure 1:
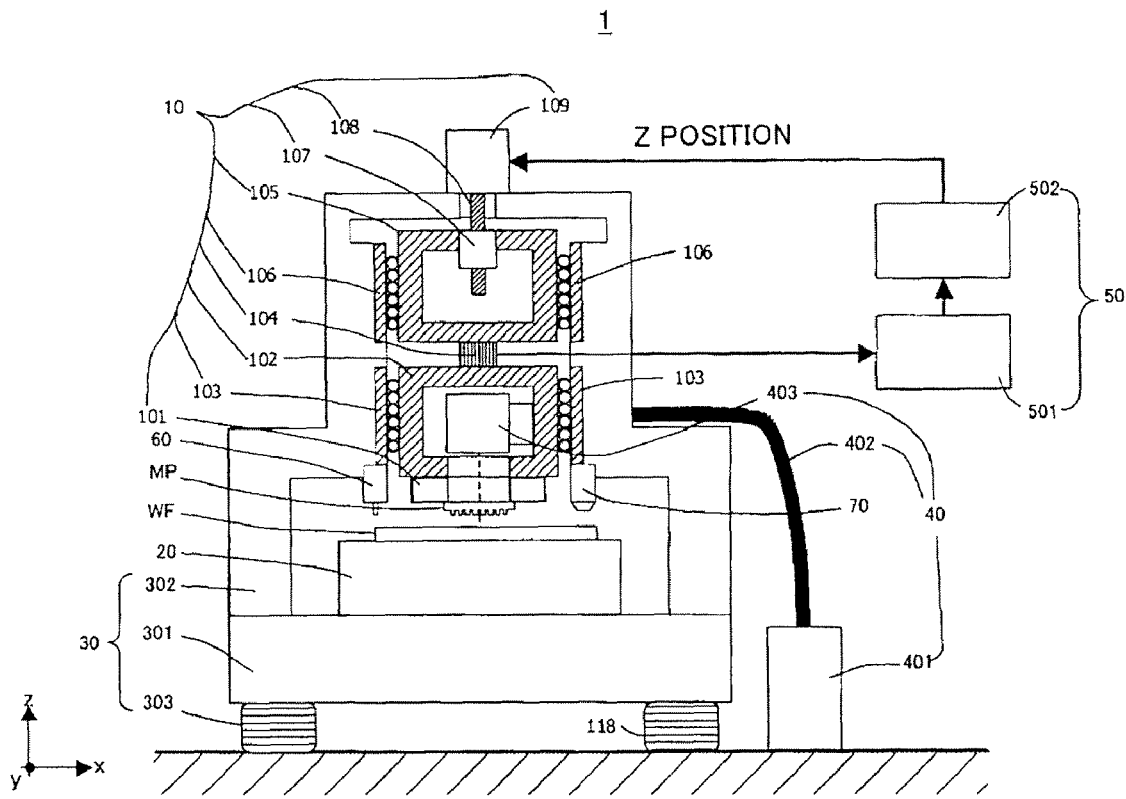
FIG. 1 is a schematic sectional view showing a structure of a processing apparatus according to one aspect of the present invention.

Referring now to the accompanying drawings, a description will be given of a preferred embodiment of the present invention. The same or corresponding elements in each figure are designated by the same reference numerals, and a duplicate description thereof will be omitted.

FIG. 1 is a schematic sectional view of a processing apparatus 1 according to one aspect of the present invention. The processing apparatus is a nanoimprint apparatus that transfers a pattern to a target member by pressing a mold having a pattern, against the target member to which a resin (including a resist) is applied. Here, that the mold is pressed against the resin applied to the target member means that the mold contacts the resin but the mold may or may not contact the target member. The resin, as used herein, is either the resin that serves as the resist when the mold transfers its pattern, or the resin that remains on the target member to serve as the pattern on the target member. The resin may be substituted by a material other than the resin. The processing apparatus 1 of this embodiment is a step-and-repeat nanoimprint apparatus of the UV curing type.

The processing apparatus 1 includes a pressure mechanism 10 that presses a mold against a wafer, a wafer stage 20 that moves the wafer in XY directions, a structure 30 that supports the entire processing apparatus 1, an illumination system 40 that cures the UV curing resin, and a control system 50 that controls driving of the pressure mechanism 10. The pressure mechanism 10 of this embodiment moves only the mold but it is sufficient that the mold and the target member move relative to each other. The processing apparatus 1 further includes a coater mechanism 60 that coats the UV curing resin (resist) onto the wafer WF, and an alignment scope 70.

In FIG. 1, MP denotes a mold made of a UV transmitting material, such as quartz, which is used to cure the UV curing resin. A transfer pattern is three-dimensionally formed on a bottom surface of the mold MP. WF denotes a wafer as a target member or a substrate to be processed, and the UV curing resin is coated on its surface. The UV curing resin is a material that cures in response to the UV, and is a viscous material or liquid before the UV is irradiated.

The pressure mechanism 10 includes a mold stage 101, a first mold driver 102, a first guide 103, a load sensor 104, a second mold driver 105, a second guide 106, a ball nut 107, a ball screw 108, and a motor 109.

The pressure mechanism 10 drives the motor 109, rotates the ball nut 108, and integrally moves the second mold driver 105, the load sensor 104, and the first mold driver 102 connected to the ball nut 107 in a perpendicular direction or a Z direction. Thereby, the mold MP is pressed against the wafer WF while the mold MP is held by the mold stage 101 connected to the first mold driver 102.

The mold stage 101 serves to hold the mold MP, and change an orientation of the mold MP. The mold stage 101 has an opening at a center part, and allows the UV light used to cure the UV curing resin to pass.

The first mold driver 102 is configured movable in the Z direction. An upper part of the first mold driver 102 is connected to the load sensor 104.

The first guide 103 is a guide mechanism that moves the first mold driver 102 in the Z direction, and uses a rolling mechanism, such as a ball or a roller. The first guide 103 of this embodiment uses a bearing, but may use an air guide.

The load sensor (measurement part) 104 serves to detect or measure the load applied to the sensor, and uses a load cell in this embodiment. The load sensor 104 detects the load applied to the mold MP when the load cell 104 presses the mold MP against the wafer WF (or a compressive load occurs) or when the mold MP is parted from the wafer WF (or a tensile load occurs). A detection result (measurement result) by the load sensor 104 is used to control driving of the mold MP. An upper part of the load sensor 104 is connected to the second mold driver 105.

The second mold driver 105 is configured movable only in the Z direction, similar to the first mold driver 102. An upper part of the second mold driver 105 is connected to the ball nut 107. The second mold driver 105 moves in the perpendicular direction or the Z direction when the ball screw 108 engaged with the ball nut 107 rotates.

The second guide 106 is a guide mechanism configured to move the second mold driver 105 in the Z direction, similar to the first guide 103.

The motor 109 is connected to the ball screw 108. When the motor 109 drives, the second mold driver 105, the load sensor 104, and the first mold driver 102 connected to the ball nut 107 engaged with the ball screw 108 perpendicularly drive.

The wafer stage 20 holds the wafer WF, and controls the orientation of the wafer WF. The wafer stage 20 serves to move and position the wafer WF in the XY directions. The wafer stage 20 steps in the X or Y direction in sequentially transferring the pattern of the mold MP. The position and orientation of the wafer stage 20 is highly precisely controlled by a laser interferometer (not shown).

The structure 30 includes a stool 301, a frame 302, and a vibration isolator 303. The stool 301 burdens the entire rigidity of the processing apparatus 1, and supports the wafer stage 20 and the frame 302. The stool 301 is placed on a floor via the vibration isolator 303. The vibration isolator 303 shields the vibrations from the floor in order to maintain the highly precise positioning accuracy required for the wafer stage 20. The vibration isolator 303 includes an air damper, etc.

The illumination system 40 includes a lamp box 401, an optical fiber 402, and an illumination optical system 403. The UV light used to cure the UV curing resin is generated by a high-pressure mercury lamp arranged in the lamp box 401, and introduced to the processing apparatus 1 via the optical fiber 402. An angle of view and the intensity distribution of the UV light introduced to the processing apparatus 1 are shaped, and the UV light is irradiated onto the UV curing resin applied to the wafer WF through the mold MP.

The illumination optical system 403 is arranged in the first mold driver 102. The illumination optical system 403 includes a lens group that makes uniform a luminance distribution, and a mirror that irradiates the UV light via the opening formed in the lower part of the first mold driver 102, and deflects the UV light.

The control system 50 includes a controller 501, and a motor driver 502, and controls the pressure mechanism 10 that drives the mold MP in the Z direction. The controller 501 operates a detection result of the load sensor 104, and outputs a driving signal to the motor driver 502. The motor driver 502 drives the motor 109 in accordance with the driving signal from the controller 501.

The coater mechanism 60 is a mechanism that serves to apply the UV curing resin as a resist to the wafer WF, and to drop the UV curing resin to a position that is to transfer the pattern of the mold MP. When the UV curing resin is previously coated onto the entire wafer WF through spin coating, the coater mechanism 60 is unnecessary.

The alignment scope 70 is held on the frame 302, and measures the alignment mark arranged on the wafer WF in transferring the pattern of the mold MP to the wafer WF. The alignment scope 70 is used for an alignment between the mold MP and the wafer WF.

A description will be given of an operation of the processing apparatus 1. First, the mold MP is fed in the processing apparatus 1 through a mold feeding system (not shown), and installed on the mold stage 101. A measurement system (not shown) measures an orientation of the plane of the mold MP on which the pattern is formed (or the patterned plane). The mold stage 101 is driven based on the measurement result, and the orientation of the mold MP is accorded with an apparatus reference. The apparatus reference is, for example, a scanning direction of the wafer stage 20 (XY plane).

Next, a wafer feeding system (not shown) feeds the wafer WF in the processing apparatus 1. The alignment scope 70 measures the alignment mark on the wafer WF, and positions the wafer WF on the wafer stage 20 based on the measurement result.

Next, the pattern of the mold MP is sequentially transferred onto the wafer WF. The transfer operation includes the pressing step, the curing step, and the releasing step. The pressing step uses the coater mechanism 60 to initially drop the UV curing resin at a mold MP's pattern transferring position on the wafer WF. The wafer WF is positioned at a position below the mold MP. The pressure mechanism 10 is driven to press the mold MP against the wafer WF (or the resin or resist applied to the wafer). The UV curing resin flows along the patterned plane of the mold MP or the pattern formed on the mold MP when the mold is pressed against the wafer.

A detailed description will now be given of the pressing step. FIGS. 2A-2C are schematic views showing the actions of the first mold driver 102, the load sensor 104, and the second mold driver 105 in the pressing step. In FIGS. 2A to 2C, ZA denotes a Z position or a position of the first mold driver 102 in the Z direction, and ZB denotes a Z position or a position of the second mold driver 105 in the Z direction. The load sensor 104 is a load cell, as discussed above. The load cell houses a spring structure, and measures a load by converting the load into the spring's expansion and contraction amount when a tensile or compressive load is applied. The load sensor 104 can be expressed by the spring that expands or contracts in accordance with the load.

FIG. 2A indicates the starting time of the pressing step. Referring to FIG. 2A, the first mold driver 102 hangs on the second mold driver 105 via the load sensor 104. The load sensor 104 receives, as a total load, weights of the first mold driver 102 and the mold MP. The processing apparatus 1 (load sensor 104) is designed to recognize this state as a load of 0.

FIG. 2B indicates that the second mold driver 105 descends as the pressing step starts, and the mold MP contacts the wafer WF.

FIG. 2C indicates a state in which the second mold driver 105 further descends from the state shown in FIG. 2B or the mold MP is pressed against the wafer WF. The first mold driver 102 and the mold MP do not move from the state shown in FIG. 2B, but the second mold driver 105 further descends. The action of the second mold driver 105 corresponds to contraction of the load sensor 104, and the mold MP consequently generates a pressure to the wafer WF. The pressure is detected as an output of the load sensor 104.

FIG. 3A is a graph showing actions of the first mold driver 102 and the second mold driver 105 in the pressing step. FIG. 3B is a graph showing load changes relative to the actions of the first mold driver 102 and the second mold driver 105 shown in FIG. 3A. The action of the second mold driver 105 corresponds to a driving signal from the controller 501 (or a driving command from the controller 50).

In the graph shown in FIG. 3A, an ordinate axis denotes the Z positions of the first mold driver 102 and the second mold driver 105, and an abscissa axis denotes the time. As discussed above, ZA denotes a Z position of the first mold driver 102, and ZB denotes a Z position of the second mold driver 105. The Z positions of the first mold driver 102 and the second mold driver 105 are on the basis of a starting position of the releasing step, which will be described later. The releasing step is the step used to separate the mold form the wafer (or the resist or resin applied to the wafer). At the outset of this step, the mold adheres to the wafer.

In the graph shown in FIG. 3B, an ordinate axis denotes the load applied to the load sensor 104, and an abscissa axis denotes the time. The time base is common between the graph shown in FIG. 3A and the graph shown in FIG. 3B.

Referring to FIGS. 3A and 3B, the mold MP gradually descends from a state in which the mold MP is spaced from the wafer WF (i.e., from time T0 to time T1), and the mold MP contacts the wafer WF when the mold MP descends to some extent (i.e., at time T1). When the second mold driver 105 descends, the first mold driver 102 stops but the load increases. When the load reaches a predetermined load at time T2, the second mold driver 105 stops descending. The pressing step thus ends.

Thus, by controlling positions of the first mold driver 102, the second mold driver 105, and the ball screw 108, etc., the pressure mechanism 10 that generates the pressure needs an element, such as a spring function, which converts a displacement (or driving amount) into a load. The load sensor 104 of this embodiment serves as the element that converts the displacement into the load. When the element that converts the displacement into the load is made of a very rigid member, the load greatly changes and the controllability remarkably lowers even for a very small displacement (or driving amount in the Z direction).

When the pressing step ends, the procedure moves to the curing step. The curing step irradiates the UV light while pressing the mold MP against the wafer WF, and cures the UV curing resin applied to the wafer WF.

When the curing step ends, the procedure moves to releasing step. The releasing step moves the pressure mechanism 10, and releases or separates the mold MP from the wafer WF. The releasing step will be described in detail later.

When the transfer operation thus ends, a replica pattern having the same shape as the pattern shape of the mold MP is formed on the UF curing resin on the wafer WF. Then, the wafer stage 20 is driven, and the UV curing resin is dropped at the next transfer position on the wafer WF. Then, the wafer WF is moved to the transfer position, and the above pressing, curing, releasing steps repeat.

Figure 4A:
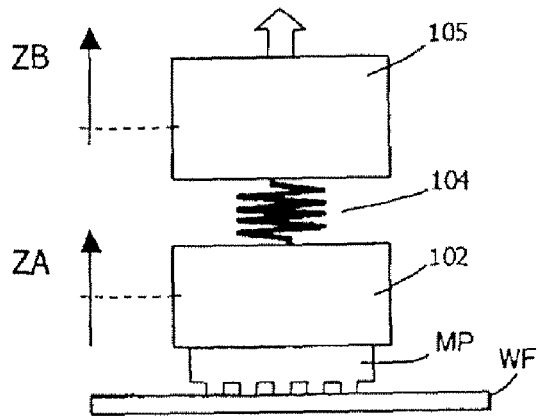
FIGS. 4A-4C are schematic views showing actions of the first mold driver, the load sensor, and the second mold driver in the releasing step in the processing apparatus shown in FIG. 1.

Referring now to FIGS. 4A to 5B, the releasing step will be described in detail. FIGS. 4A to 4C are schematic views of the actions of the first mold driver 102, the load sensor 104, and the second mold driver 105 in the releasing step.

Figure 4B:
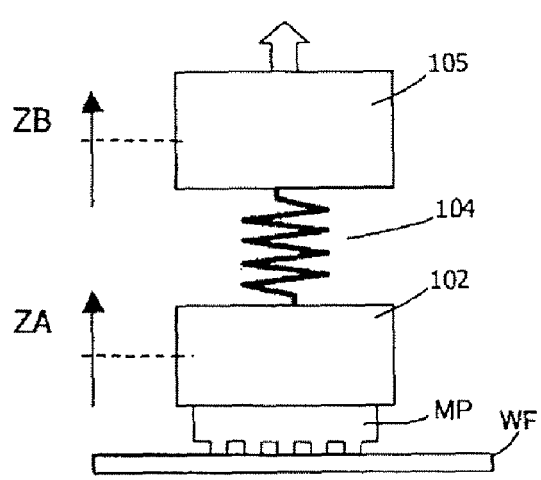
Figure 4C:
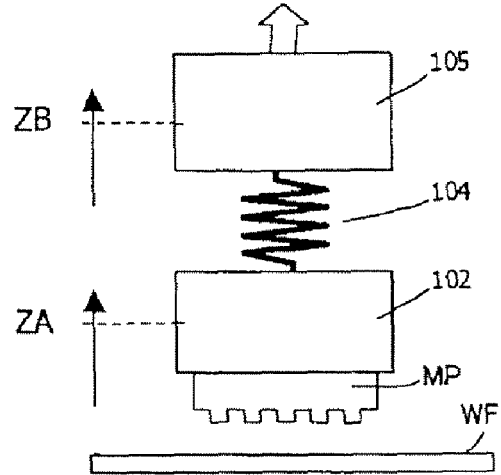

FIG. 4A shows the starting time of the releasing step, which is the same state as that of the completion time of the pressing step. Referring to FIG. 4A, the second mold driver 105 moves or descends in the Z direction, and the load sensor 104 shrinks. When the second mold driver 105 ascends from this state as shown in FIG. 4B, the mold MP is not separated from the wafer WF even when the second mold driver 105 ascends from a position (shown in FIG. 2B) at which the mold MP adheres to the wafer WF in the pressing step. This is because the UV curing resin applied to the wafer WF cures and serves as the adhesive, and an adhesive force acts between the mold MP and the wafer WF. When the second mold driver 105 is further moved up, as shown in FIG. 4C, the mold MP is separated from the wafer WF due to the tensile force that acts between the mold MP and the wafer WF. In other words, when the tensile force that acts between the mold MP and the wafer WF exceeds the adhesion force that acts between the mold MP and the wafer WF, the mold MP is released from the wafer WF.

FIG. 5A is a graph showing the actions of the first mold driver 102 and the second driver 105 in the releasing step. FIG. 5B is a graph showing a load change relative to the actions of the first mold driver 102 and the second mold driver 105 shown in FIG. 5A. In FIGS. 5A and 5B, similar to FIGS. 3A and 3B, ZA and ZB are the Z positions on the basis of the starting position of the first mold driver 102 and the second mold driver 105 in the releasing step. The action of the second mold driver 105 corresponds to a driving signal from the controller 501 (or the driving command) from the control system 50).

In the graph shown in FIG. 5A, an ordinate axis denotes the Z positions of the first mold driver 102 and the second mold driver 105, and an abscissa denotes the time. In the graph shown in FIG. 5B, an ordinate axis denotes the load applied to the load sensor 104, and an abscissa axis denotes the time. The time base is common in the graph shown in FIG. 5A and the graph shown in FIG. 5B.

Referring to FIGS. 5A and 5B, the releasing step starts from time T3, and the second mold driver 105 starts ascending. Thereby, the shrinking load sensor 104 gradually expands and returns to the natural length at time T4 with a load of 0. When the second mold driver 105 further ascends, the load sensor 104 expands longer than its natural length because the mold MP and the wafer WF are bonded to each other. The tensile force occurs in this state (FIG. 4B). When the second mold driver 105 further ascends, the tensile force exceeds the release force (or the adhesion force between the mold MP and the wafer WF), and the mold MP is released from the wafer WF at time T5. After the mold MP is released from the wafer WF, the mold MP further ascends to obtain a sufficient interval between the mold MP and the wafer WF, and stops at a predetermined position.

FIGS. 5A and 5B show the action of the second mold driver 105 when the ascending or moving speed of the second mold driver 105 is constant in the releasing step. The UV curing resin has properties similar to those of the adhesive agent, as discussed above. The pattern could break in releasing the mold MP unless the second mold driver 105 (mold MP) is driven at a low speed. When the second mold driver 105 (mold MP) is driven at a high speed, part of the pattern adheres to the mold MP and the UV curing resin can be peeled off from the wafer WF. The conventional processing apparatus moves up the second mold driver 105 or the mold MP at a constant speed as shown in FIGS. 5A and 5B, and spends a very long time in the releasing step so as to protect the pattern formed on the wafer WF.

The present invention freely sets a driving pattern of the mold MP (second mold driver 105) in the releasing step in order to shorten the time period necessary for the releasing step. The present invention drives the mold MP (or the second mold driver 105) at a low speed (which may be variable or fixed) only for a time period necessary for the mold MP to release from the wafer WF, shortening the entire time period for the releasing step. In other words, until the mold MP is released from the wafer or the resin or the resist applied to the wafer WF, the mold is moved at a low speed and the released mold is moved at a high speed.

Referring to FIGS. 5A and 5B, the release operation that separates the mold MP from the wafer WF contains a load relaxing time period, a time period during which the releasing force that releases the mold MP from the wafer WF gradually increases, and a time period during which the mold MP moves up to the predetermined position after the mold is released. The actual release operation that separates the mold MP from the wafer WF is an instant. A high speed of the mold MP on the releasing instant would destroy the pattern formed on the wafer WF, whereas a sufficiently low speed of the mold MP would maintain the pattern formed on the wafer WF. In other words, a low moving speed of the mold MP on the releasing instant can prevent damages of the pattern formed on the wafer WF.

A concrete description will now be given of a driving pattern of the second mold driver 105 or the mold MP in the releasing step according to the present invention.

First Embodiment

FIGS. 6A and 6B are views for explaining the first embodiment. FIG. 6A is a graph showing actions or driving patterns of the first mold driver 102 and the second mold driver 105. The action of the second mold driver 105 is driven based on the driving signal from the controller 501 (or the driving command of the control system 50). FIG. 6B is a graph showing a load change relative to the actions of the first mold driver 102 and the second mold driver 105 shown in FIG. 6A. In FIGS. 6A and 6B, a solid line ZB indicates the driving pattern and the load change of the second mold driver 105 in the first embodiment, and a broken line indicates the conventional driving pattern and load change. An alternate long and shot dash line ZA indicates a driving pattern of the first mold driver 102.

The driving pattern provided by the processing apparatus 1 or the second mold driver 105 is available from the conditioning transfer. For example, the releasing step is executed by changing the moving speed of the second mold driver 105 or the mold MP, and whether the pattern on the wafer WF destroys is checked. This configuration can obtain the releasing force and the moving speed of the second mold driver 105 which would not destroy the pattern formed on the wafer WF. The moving speed of the second mold driver 105 which do not destroy the pattern formed on the wafer WF depend upon the surface states (release processes) of the mold MP and the UV curing resin applied to the wafer WF. A relationship between the driving amount of the second mold driver 105 and the load applied to the load sensor 104 is a value unique to the apparatus, and may be measured only once after the apparatus is assembled.

Referring to FIGS. 6A and 6B, a driving command to the second mold driver 105 relaxes a load due to the pressure of the mold MP, the second mold driver 105 is driven at a high speed before a position Z1 or before the releasing force that releases the mold MP from the wafer WF is generated. Then, a driving command to the second mold driver 105 drives the second mold driver 105 at a low speed that would not destroy the pattern formed on the wafer WF up to a position Z2 beyond the release position. The second mold driver 105 is driven again at a high speed after the position Z2 to move the mold MP up to the predetermined position. In the second mold driver 105, a speed ratio between the above low speed and the high speed is preferably 10 times or higher, more preferably 100 times or higher.

When the second mold driver 105 is driven with the driving pattern shown in FIG. 6A, a time period for the releasing step can remarkably reduce. More specifically, it is understood from FIG. 6B that time T'5 necessary for release from release starting time T3 and time T'6 necessary for the mold MP to move up to the predetermined position can be remarkably earlier than constant-speed release time periods T5 and T6. A sufficiently slow moving speed of the second mold driver 105 or the mold MP as soon as the mold MP is released from the wafer WF would not destroy the pattern formed on the wafer WF.

Assume that a first state is a state in which the mold MP that adheres to the resin starts moving in a direction separating from the resin, and a second state is a state in which the mold MP that moves in the direction separating from the resin is about to separate from the resin. Then, the second mold driver 105 is controlled or driven so that a changing rate of the load that occurs between the mold MP and the resin in the first state (load changing amount/time) can be smaller than that in the second state. In other words, the second mold driver 105 is controlled or driven so that a relative speed between the mold MP and the wafer WF in the first state can be smaller than that in the second state.

A state from when the mold MP that adheres to the resin starts moving in a direction separating from the resin to when the mold MP is separated from the resin is divided into a compressive pressure generating state (compression state), a tensile stress generating state (tensile state), and a separation state. The compressive pressure generating state is a state in which a suppress strength occurs between the mold MP and the resin. The tensile stress generating state is a state in which a tensile stress occurs between the mold MP and the resin. The separation state is a state in which the mold MP is separated from the resin. In that case, the second mold driver 105 is controlled or driven so that the second mold driver 105 has a slow moving speed in the tensile state.

The controller 501 of the first embodiment has a memory, and the memory stores a driving pattern of the above second mold driver 105 through interface means (not shown), i.e., the solid line ZB shown in FIG. 6A. The controller 501 outputs a driving signal to the motor driver 502 in accordance with the driving pattern stored in the memory in the releasing step. In other words, the controller 501 controls a moving amount of the mold MP based on an elapsed time period from when the mold MP starts moving in a direction separating from the resin. Thereby, the motor 109 is driven, and the second mold driver 105 is driven in accordance with the driving pattern stored in the controller 501. The first embodiment drives the second mold driver 105 under open control, does not need a complicated control system, such as a feedback control, and can realize an arbitrary driving pattern at a comparatively low cost.

This configuration controls driving of the second mold driver 105, reduces a time period that does not directly lead to a collapse of the pattern formed on the wafer WF, and can quickly complete the releasing step without destroying the pattern. Therefore, the processing apparatus 1 can improve the throughput and productivity, and produce devices inexpensively.

The first embodiment linearly varies a driving pattern of the second mold driver 105, but can provide a similar effect as long as the pattern is a driving pattern at which the mold MP is separating from the wafer WF at a low speed, such as a driving pattern that gradually changes the speed.

Second Embodiment

The second embodiment drives the second mold driver 105 at a low speed that would not destroy the pattern formed on the wafer WE on the releasing instant, similar to the first embodiment, and drives the second mold driver 105 at a high speed other than that period, thereby quickening the releasing step. The second embodiment is different from the first embodiment in the control system 50. The control system 50 of the second embodiment monitors the load applied to the load sensor 104, and switches a moving speed of the second mold driver 105 using a predetermined value as a trigger.

Figures 7A, 7B:
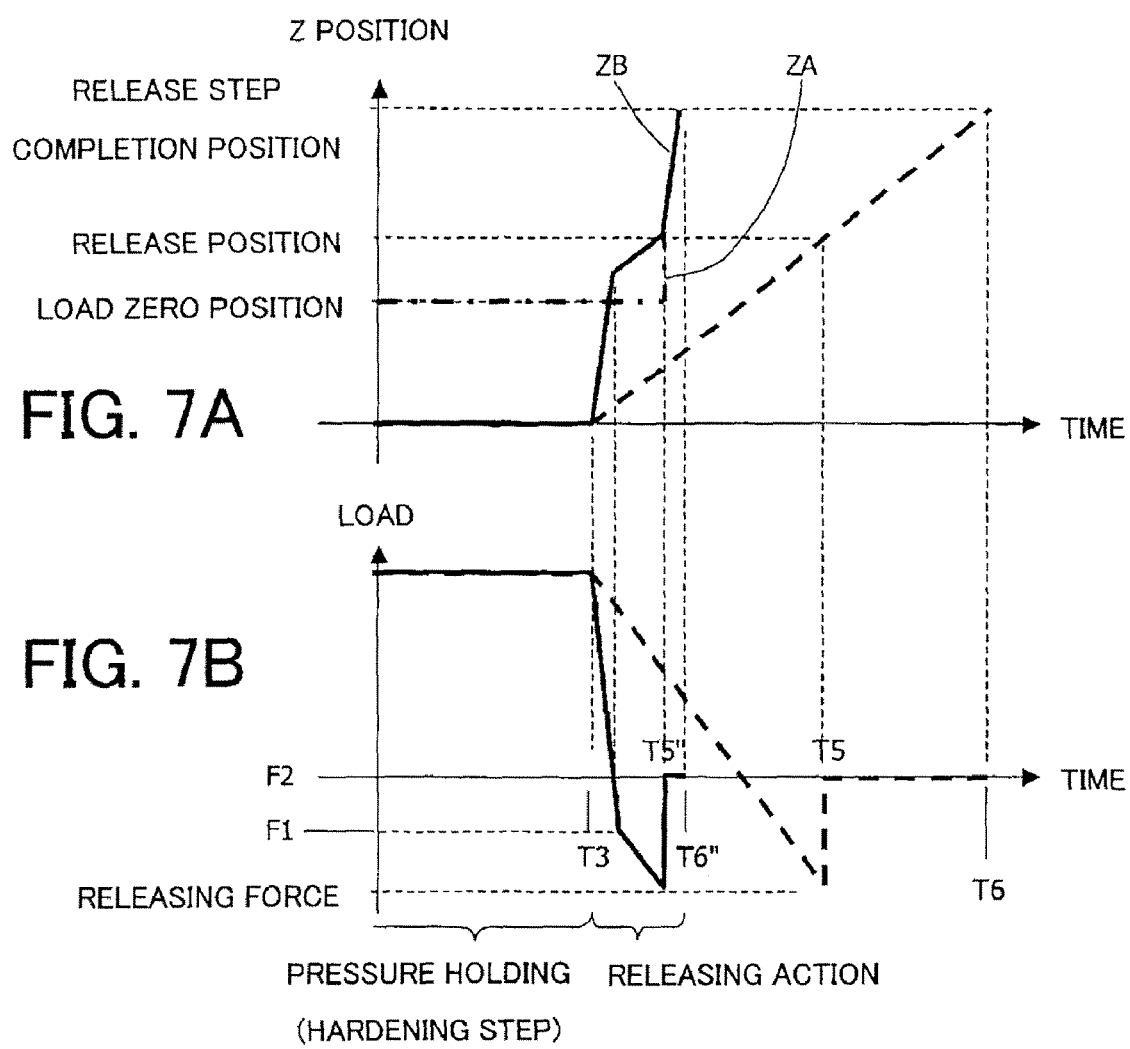
FIGS. 7A and 7B are views for explaining a second embodiment of the present invention.

FIGS. 7A and 7B are views for explaining the second embodiment. FIG. 7A is a graph showing actions or driving patterns of the first mold driver 102 and the second mold driver 105. The second mold driver 105 is driven based on a driving signal from the controller 501 or a driving command from the control system 50. FIG. 7B is a graph showing a load change relative to the actions of the first mold driver 102 and the second mold driver 105 shown in FIG. 7A. In FIGS. 7A and 7B, a solid line ZB denotes a driving pattern and the load change of the second mold driver 105 in the second embodiment, and a broken line denotes a conventional driving pattern and load change. An alternate long and short dash line ZA denotes a driving pattern of the first mold driver 102. T3 is the starting time of the releasing step, T5" is the release instant time, and T6" is the releasing step completion time.

In the conventional driving pattern that drives the mold MP at a constant speed sets T5 to the release instant time, and T6 to the releasing step completion time.

Referring to FIGS. 7A and 7B, the second mold driver 105 ascends at a high speed as the releasing step starts. An output of the load sensor 104 is monitored. When an output of the load sensor 104 reaches F1, a moving speed of the second mold driver 105 is turned to a low speed. When an output value of the load sensor 104 reaches the predetermined value F1 (which is 0 in this embodiment but may be another value, such as a patterned shape and a driving stage performance), a relative moving speed between the mold and the wafer in the perpendicular direction is lowered. The moving speed may be downed once or stepwise, but maintained at a desired moving speed. The low speed is a speed enough small not to destroy the pattern formed on the wafer WF.

Monitoring of an output of the load sensor 104 continues even after the moving speed of the second mold driver 105 is turned to the low speed.

When the second mold driver 105 is driven at a low speed, the tensile load of the mold MP exceeds the releasing force and the mold MP is separated from the wafer WF at time T5". Then, an output of the load sensor 104 becomes 0. The controller 501 recognizes that the mold MP is released from the wafer WF when the output of the load sensor 104 becomes F2 (which is 0 in the second embodiment), and switches the moving speed of the second mold driver 105 to a high speed. Then, the mold MP is moved up to the predetermined position, and the releasing step ends.

The releasing step initially drives the mold at a first speed, then the mold at a second speed, and finally the mold at a third speed. The first and second speeds are relative speeds between the mold and the wafer while the mold adheres to or contacts the wafer or the resist or resin of the wafer. The third speed is a relative speed between the mold and wafer while the mold and the wafer are completely separated from each other. In this embodiment, among the first, second and third speeds, the third speed is the highest, the first speed is the next, and the second speed is the last. Preferably, the first speed is twice (more preferably five times) as high as the second speed, and the third speed is five times (more preferably ten times) as high as the second speed.

F1 and F2 as outputs of the load sensor 104 are previously stored in the memory of the controller 501. F1 is set to a value that is smaller than but extremely close to the releasing force. F2 may be set to a tensile load much smaller than the releasing force so that a state in which the mold MP is separated from the wafer WF can be detected.

The control system 50 of the second embodiment becomes more complex than that of the first embodiment since the load sensor 104 always monitors the output of the load sensor 104. The first embodiment has a time period used to drive the second mold driver 105 at a low speed even when the mold MP actually is separated from the wafer WF. On the other hand, the second embodiment recognizes, based on an output of the load sensor 104, the instant when the mold MP is actually separated from the wafer WF, and can pulls up the mold MP at a high speed just after the mold MP is separated from the wafer WF. Thus, the second embodiment can complete the releasing step within a shorter time period than that of the first embodiment.

A time period can be shortened which does not directly lead to a collapse of the pattern formed on the wafer WF by controlling driving of the second mold driver 105, and the releasing step can be completed within a very short time without destroying the pattern. Therefore, the processing apparatus 1 can improve the throughput and the productivity, and produce the devices inexpensively.

The second embodiment switches the moving speed of the second mold driver 105 using an output of the load sensor 104 or the load, but may use a load changing rate. A similar effect is available when the position or speed change of the first mold driver 102 is used as a trigger. Alternatively, a position detecting sensor may be arranged in the second mold driver 105, and a change of a relative position between the second mold driver 105 and the first mold driver 102 may be used as a trigger. The mold stage 101 may have a means for detecting a change of a relative orientation between the mold MP and the wafer WF or the resist or resin applied to the wafer WF, and use as a trigger a changing rate of an orientation between the wafer WF and the mold MP. A measurement part may measure a state quantity between the mold MP and the wafer WF, such as a load, a load changing rate, and a relative orientation between the mold MP and the wafer WF, and a driving speed of the second mold driver 105 may be controlled based on a measurement result.

Third Embodiment

Similar to the first and second embodiments, a third embodiment drives the second mold driver 105 at a low speed that does not destroy the pattern formed on the wafer WF on the releasing instant, and drives the second mold driver 105 at a high speed other than that period, thereby completing the releasing step quickly. The third embodiment is different from the first embodiment in the control system 50. The control system 50 of the third embodiment stores a load changing pattern in the memory, and feedback-controls the load in accordance with the load changing pattern.

The controller 501 of the third embodiment stores a relationship between the elapsed time period from starting in the releasing step and the load applied to the load sensor 104 (which is referred to as a "load table" hereinafter) in the memory, and changes the load based on the load table and the time.

Figure 8:
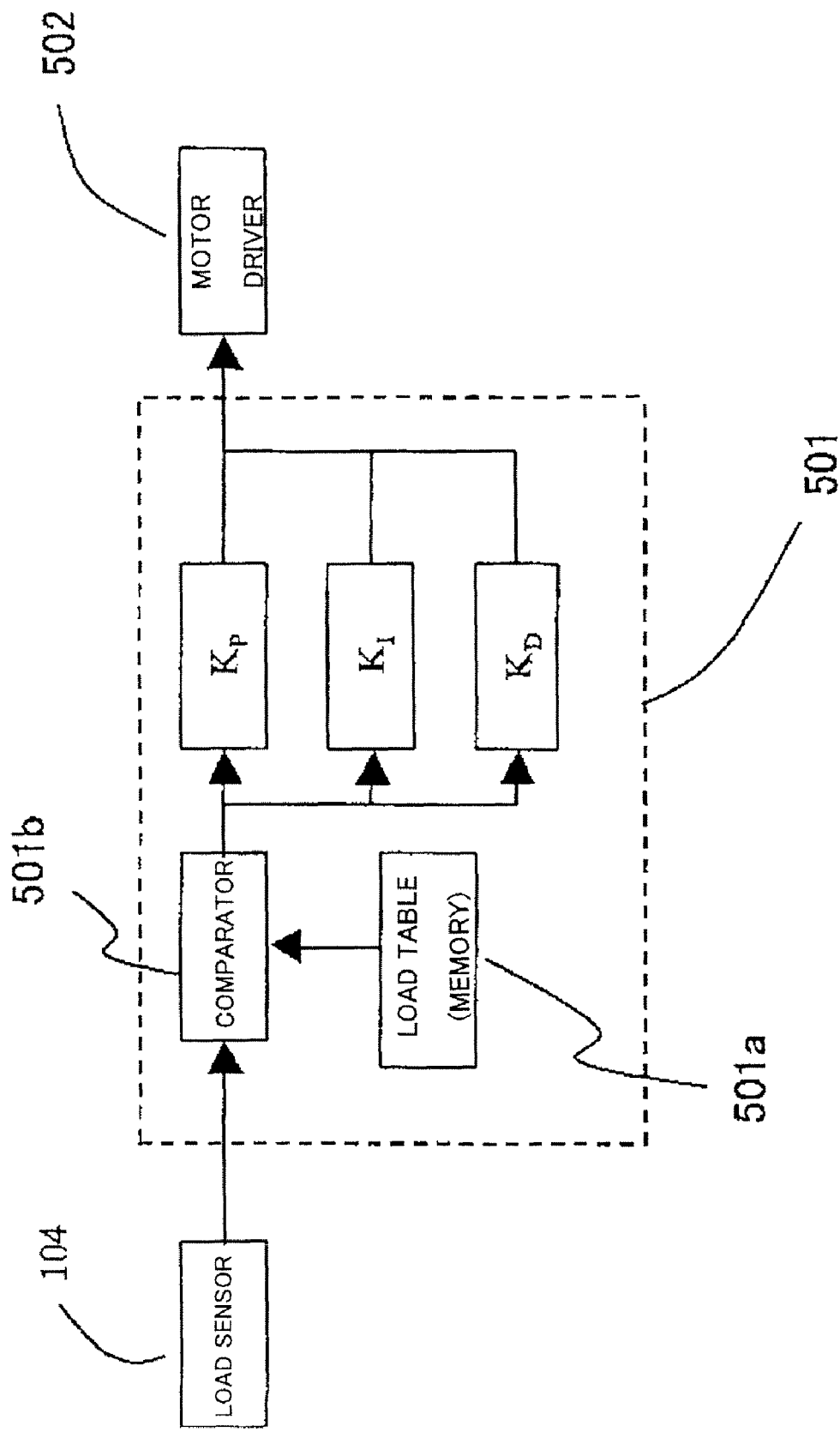
FIG. 8 is a view for explaining a load control by a controller in the processing apparatus shown in FIG. 1 according to a third embodiment of the present invention.

FIG. 8 is a view for explaining the load control by the controller 501. The controller 501 has a memory 501a that stores the load table as shown in FIG. 8, and calculates a deviation between the output from the load sensor 104 and a load value of the load table at a comparator 501b. The controller 501 outputs a driving signal to a motor driver 502 based on the calculated deviation through the PID control.

Figure 9:
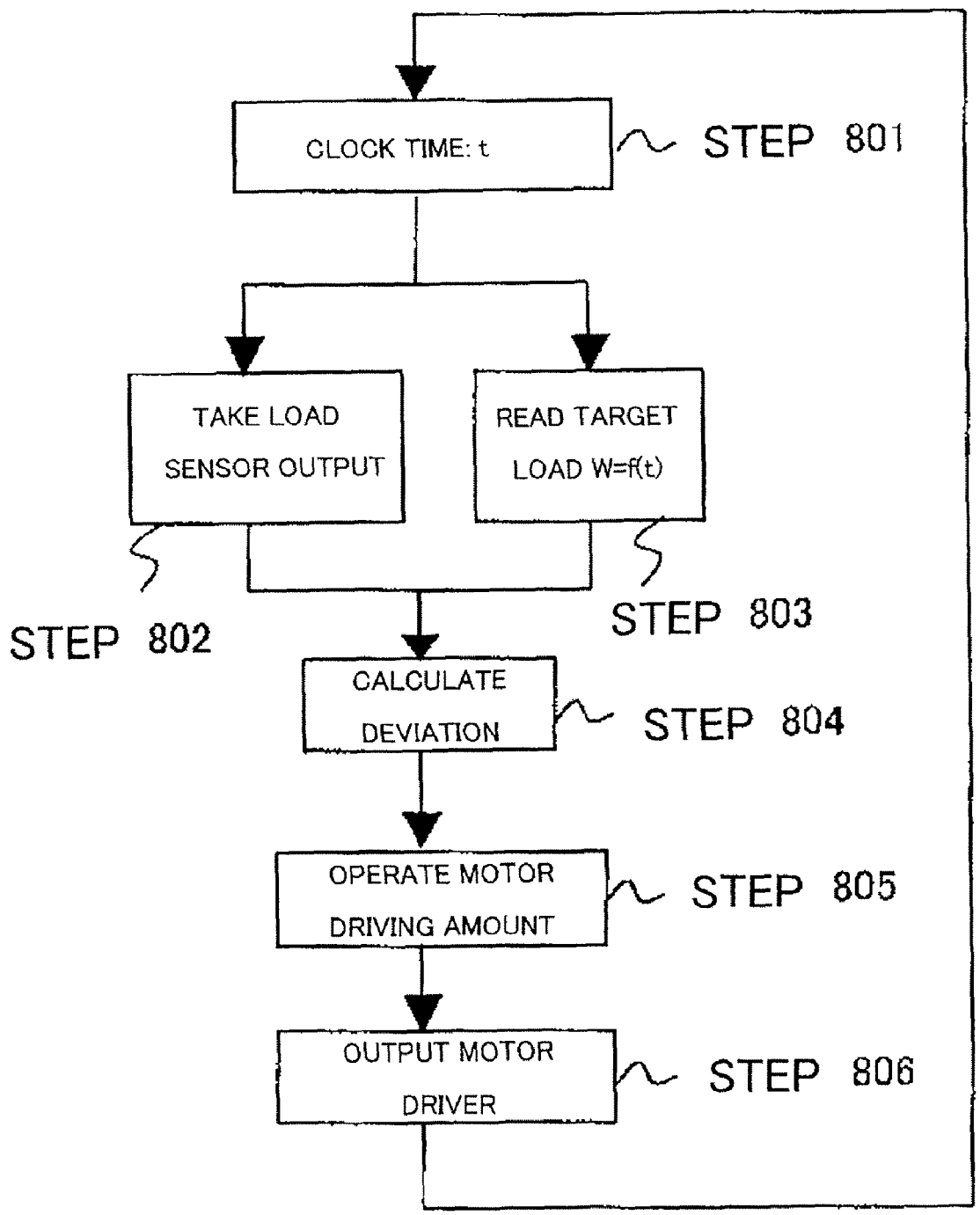
FIG. 9 is a flowchart for explaining a load control by the controller in the processing apparatus shown in FIG. 1 according to the third embodiment of the present invention.

FIG. 9 is a flowchart for explaining the load control by the controller 501. An output of the load sensor 104 is taken in (step 802) a certain time period after the releasing step starts (or at clock time t) (step 801). A target load W=f(t) at the clock time t is read out of the load table stored in the memory 501a (step 803). Next, a deviation between the output of the load sensor 104 and the read target load is calculated (step 804), and a driving amount of the motor 109 is operated based on the calculated deviation (step 805). The controller 501 repeats a series of steps 801 to 806.

Figure 10A:
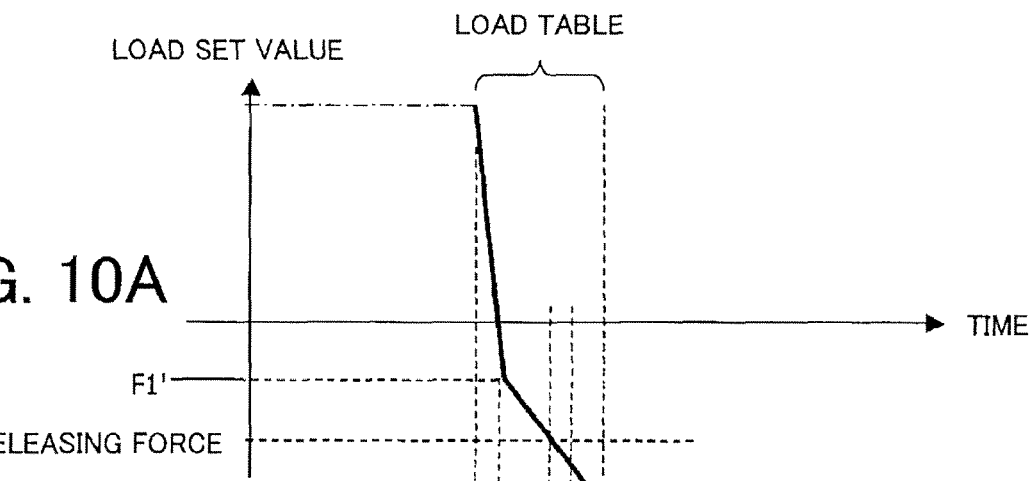
FIGS. 10A and 10B are views for explaining the third embodiment of the present invention.
Figure 10B:
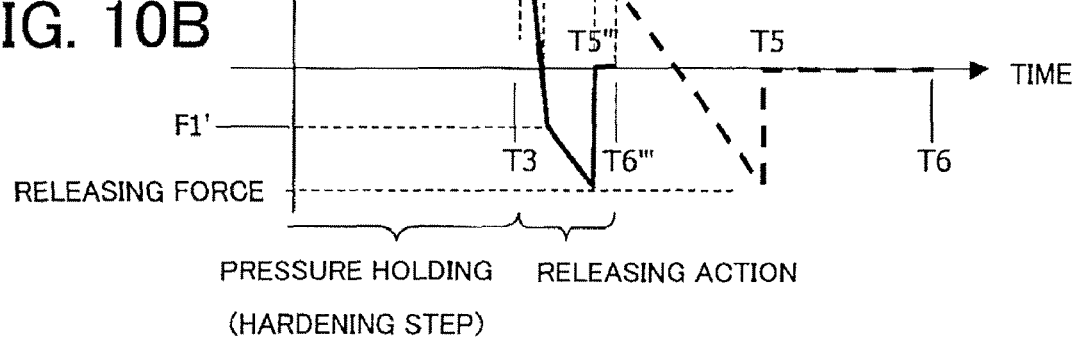

FIGS. 10A and 10B are views for explaining the third embodiment. FIG. 10A is a graph showing an illustrative load table stored in the memory 501a in the controller 501. FIG.

10B is a graph showing a load change when the second mold driver 105 is driven in accordance with the load sensor shown in FIG. 10A.

Referring to FIGS. 10A and 10B, the load table is stored in the memory 501a while the starting time of the releasing step is set to the time T3. The load table quickly releases the suppress strength until the suppress strength becomes a tensile load F1' slightly smaller than the releasing force, and generates the tensile stress. After the suppress strength becomes the tensile load F1', the load table slowly increases the tensile load. The load table is designed to increase the tensile load so that the tensile load can be greater than the presumed releasing force.

In the releasing step in accordance with the load table shown in FIG. 10A, a load change in generating the releasing force is small, and the moving speed of the second mold driver 105 at the releasing time (when the mold MP is separated from the wafer WF) becomes sufficiently small. As a result, as soon as the mold MP is separated from the wafer WF or at the time T5''', the pattern formed on the wafer WF never destroys.

When the mold MP is separated from the wafer WF, the load applied to the load sensor 104 becomes 0, and subsequently the load does not change even after the motor 109 (or the second mold driver 105) is driven. Therefore, a deviation between an output of the load sensor 104 and a load value of the load table increases, and the moving speed of the second mold driver 105 becomes higher. Then, the mold MP is moved up to the predetermined position, and the releasing step ends.

An operation time period can be reduced by increasing a load changing rate of the load table just before the mold MP is separated from the wafer WF. After the mold MP is separated from the wafer WF, a difference or deviation between the target load of the load table and the output value of the load sensor increases and the mold MP is moved up at a high speed. Thereby, a time period necessary for the mold MP to move up to the predetermined position can be reduced. The instant when the mold MP is separated from the wafer WF is determined based, for example, on the output of the load sensor 104, like the second embodiment. After the mold MP is separated from the wafer WF, the mold MP can be moved up at a high speed by open driving instead of feedback control.

Thus, the releasing step can be completed very quickly without destroying a pattern formed on the wafer WF by controlling driving of the second mold driver 105 based on the appropriately set load table. Thus, the processing apparatus 1 improves the throughput and productivity, and can produce the devices inexpensively.

The third embodiment uses the ball screw 108 and the motor 109, and discusses an illustration of driving the mold MP in the Z direction. However, the present invention is directed to an invention of a control method of the load applied to the load sensor 104, and may use a method that utilizes the gas pressure and another method.

The third embodiment uses the feedback control in comparison with the first and second embodiments, and complicates the structure of the control system 50. The third embodiment may monitor only the load sensor 104, and is effective even when the driving amount of the second mold driver 105 and the load do not have a linear relationship. For instance, when the pressure mechanism 10 has a mechanical clearance, the clearance part needs an extra time period in the first and second embodiments whereas the third embodiment feedback-controls the load and can operate the load at a high speed.

Thus, the inventive processing apparatus 1 realizes the releasing step at a high speed, and provides an excellent throughput and productivity.

Figure 11:
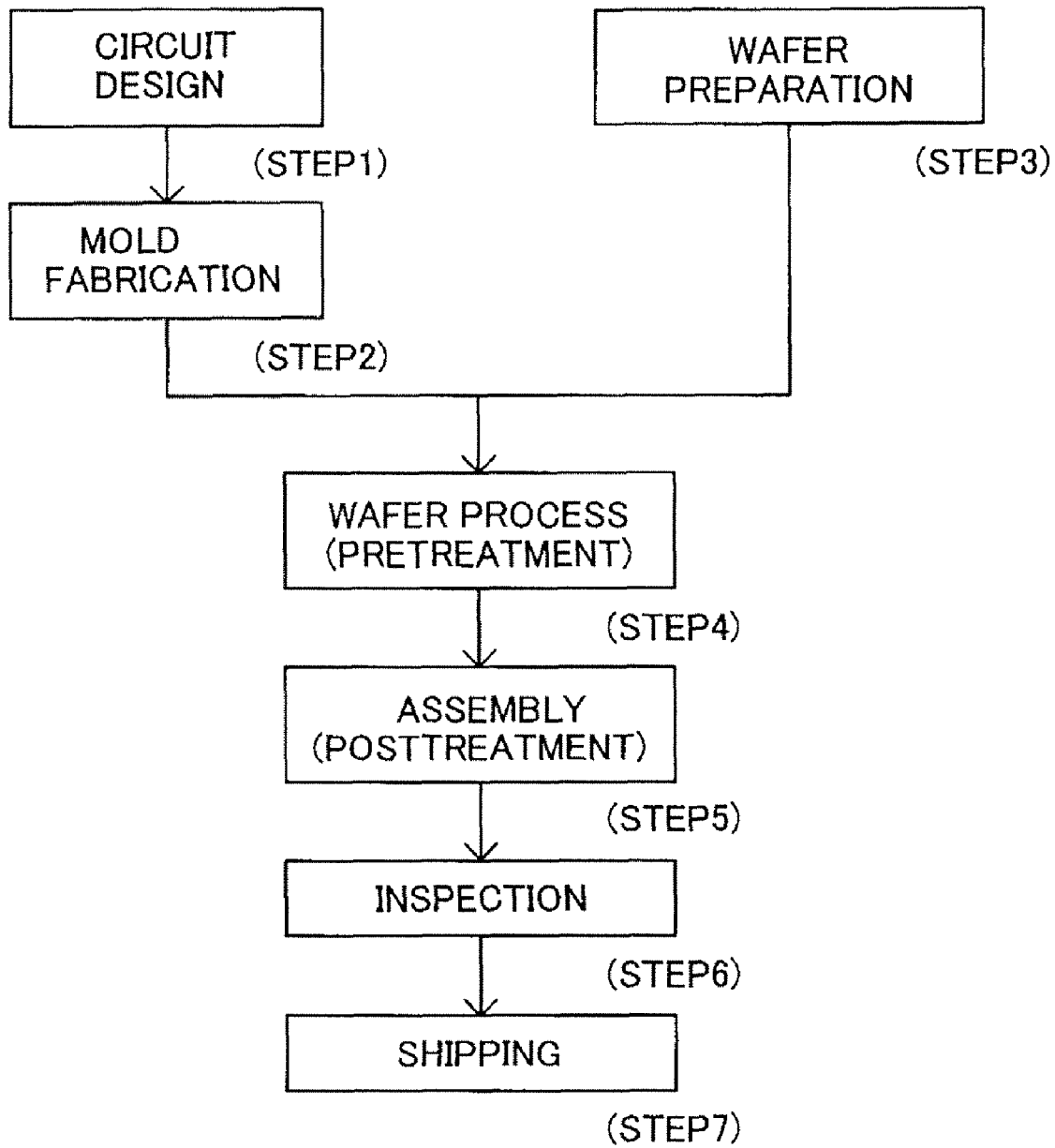
FIG. 11 is a flowchart for explaining a manufacture of a device.
Figure 12:
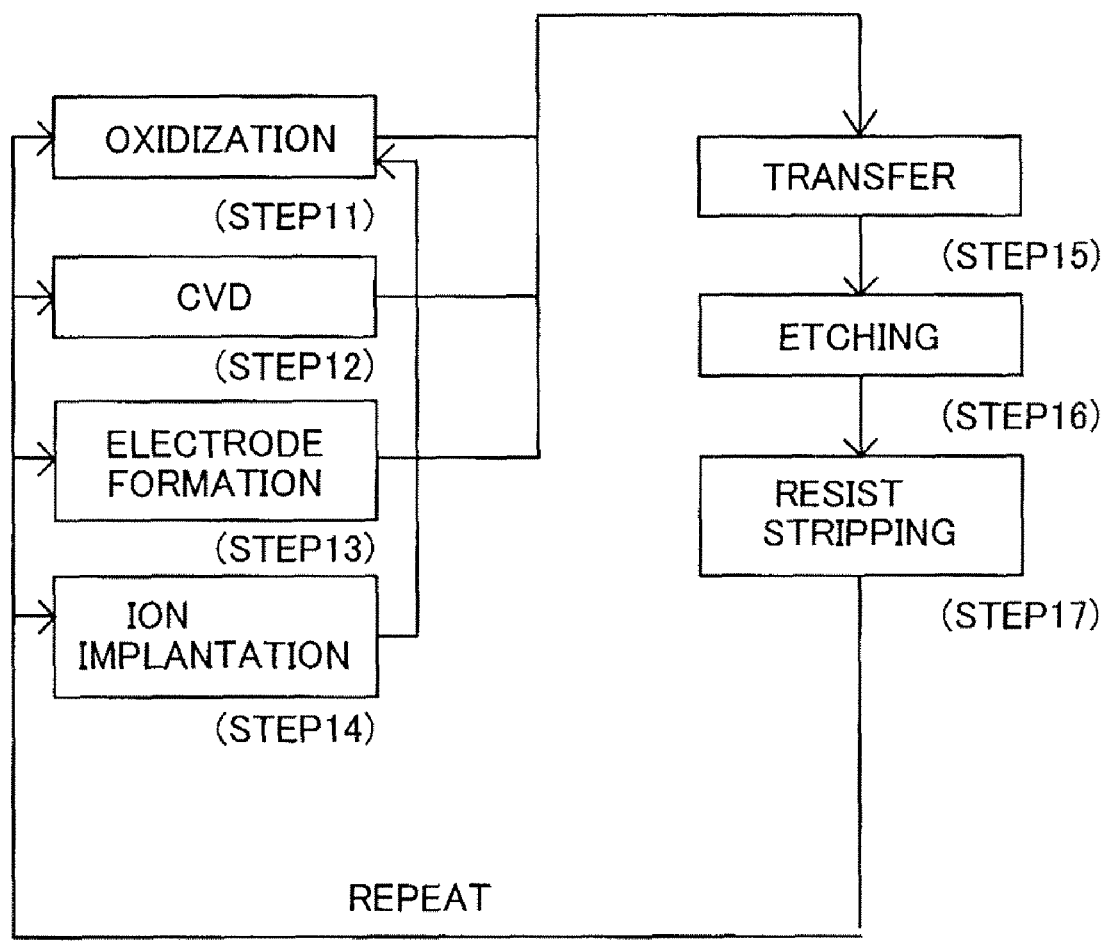
FIG. 12 is a flowchart of details of a wafer process of the step 4 shown in FIG. 11.
Figure 13A:
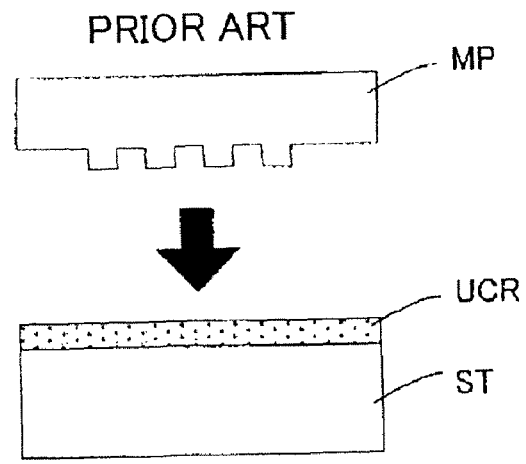
FIGS. 13A-13C are views for explaining the nanoimprint that adopts the photo-curing method.
Figure 13B:
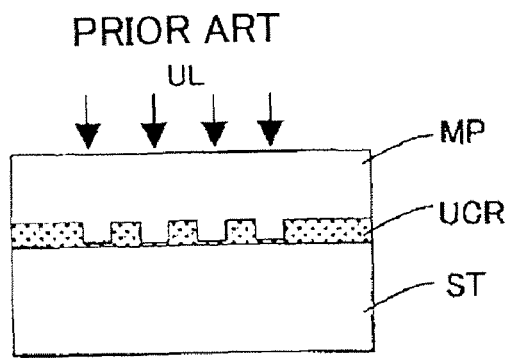
Figure 13C:
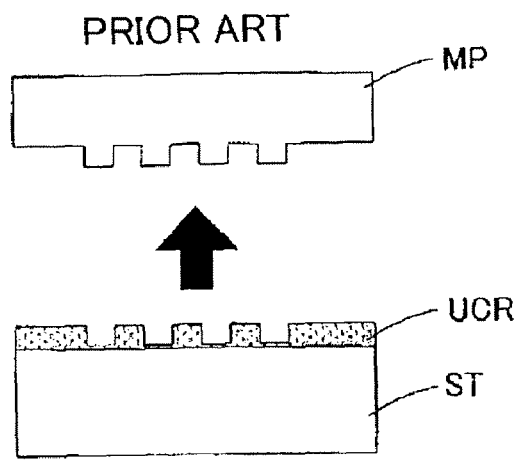

Referring now to FIGS. 11 and 12, a description will be given of an embodiment of a device manufacturing method using the processing apparatus 1. FIG. 11 is a flowchart for explaining how to fabricate devices, such as a semiconductor device and a liquid crystal display device. A description will now be given of the manufacture of a semiconductor device in an example. Step 1 (circuit design) designs a semiconductor circuit. Step 2 (mold fabrication) forms a mold that forms a pattern corresponding to a designed circuit pattern. Step 3 (wafer preparation) manufactures a wafer using a material such as silicon. Step 4 (wafer process), which is also referred to as a pretreatment, forms actual circuitry on the wafer through the nanoimprint technique using the mold and wafer. Step 5 (assembly), which is also referred to as a post-treatment, forms into a semiconductor chip the wafer formed in Step 4 and includes an assembly step (dicing and bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 12 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) coats the resist or resin on the wafer. Step 16 (transfer) presses the mold against the wafer and transfers the circuit pattern onto the wafer. Step 17 (etching) etches part other than the transferred circuit pattern. Step 18 (resist stripping) removes disused resist after etching. These steps are repeated, and multi-layer circuit patterns are formed on the wafer. The device manufacturing method can manufacture a device with a higher economical efficiency than ever. The device manufacturing method using the processing apparatus 1, and devices as a resultant product constitute one aspect of this invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions. For example, a mold position and a distance between the mold and the resist (or the UV curing resin) may be detected, and a speed of the second mold driver (mold) may be controlled based on the detection result.

While the above embodiments are applied to the nanoimprint that adopts the photo-curing method, the present invention is applicable to the nanoimprint that adopts the heat cycle method.

While this embodiment uses the UV curing resin for the resist, the present invention is similarly applicable to the cured resin.

This application claims the benefit of Japanese Patent Application No. 2006-160510, filed on Jun. 9, 2006, which is hereby incorporated by reference herein in its entirety.

What is claimed is:

1. A processing apparatus configured to transfer a pattern of a mold onto a target member by pressing the mold against an adhesive resin applied to the target member and releasing the mold from the adhesive resin, said processing apparatus comprising:
- a first driver configured to hold the mold;
- a second driver configured to connect to the first driver via a spring; and
- a controller configured to control the second driver so that an absolute value of a second load changing rate is smaller than an absolute value of a first load changing rate,
- wherein the first load changing rate is a changing rate of a load generated between the mold and the adhesive resin when the second driver starts moving in a release direction releasing the mold from the adhesive resin, the first driver stops, and the mold contacts the adhesive resin, and
- wherein the second load changing rate is a changing rate of a load generated between the mold and the adhesive resin when the second driver continues moving in the release direction, the first driver starts moving in the release direction, and the mold separates from the adhesive resin.

2. A processing apparatus according to claim 1,
- wherein the spring is a load sensor, and
- wherein the controller is configured to control the second driver based on an output of the load sensor.

3. A processing apparatus according to claim 1,
- wherein the controller is configured to control the second driver based on an elapsed time period from when a release step releasing the mold from the adhesive resin starts.

4. A processing apparatus configured to transfer a pattern of a mold onto a target member by pressing the mold against an adhesive resin applied to the target member and releasing the mold from the adhesive resin, said processing apparatus comprising:
- a first driver configured to hold the mold;
- a second driver configured to connect to the first driver via a spring; and
- a controller configured to control the second driver so that a second speed is smaller than a first speed,
- wherein the first speed is a speed of the second driver with respect to the target member when the second driver starts moving in a release direction releasing the mold from the adhesive resin, the first driver stops, and the mold contacts the adhesive resin, and
- wherein the second speed is a speed of the second driver with respect to the target member when the second driver continues moving in the release direction, the first driver starts moving in the release direction, and the mold separates from the adhesive resin.

5. A processing apparatus according to claim 4,
- wherein the controller is configured to control the second driver so that a third speed is larger than the second speed, and
- wherein the third speed is a speed of the second driver with respect to the target member when both the second driver and the first driver continue moving in the release direction and the mold does not contact the adhesive resin.

6. A processing apparatus according to claim 4,
- wherein the spring is a load sensor, and
- wherein the controller is configured to control the second driver based on an output of the load sensor.

7. A processing apparatus according to claim 4,
- wherein the controller is configured to control the second driver based on an elapsed time period from when a release step releasing the mold from the adhesive resin starts.

8. A processing apparatus configured to transfer a pattern of a mold onto a target member by pressing the mold against an adhesive resin applied to the target member and releasing the mold from the adhesive resin, said processing apparatus comprising:
- a stage configured to hold the mold; and
- a drive controller configured to control a drive of the stage so that an absolute value of a changing rate of a load generated between the mold and the adhesive resin at an instant of separation when the mold separates from the adhesive resin is smaller than an absolute value of a changing rate of a load generated between the mold and the adhesive resin when a release step releasing the mold from the adhesive resin starts.

9. A processing apparatus according to claim 8,
- wherein the drive controller is configured to control the drive of the stage so that a speed of the mold with respect to the target member when the release step ends is larger than a speed of the mold with respect to the target member at the instant of separation.

10. A processing apparatus configured to transfer a pattern of a mold onto a target member by pressing the mold against an adhesive resin applied to the target member and releasing the mold from the adhesive resin, said processing apparatus comprising:
- a stage configured to hold the mold; and
- a drive controller configured to control a drive of the stage so that a speed of the mold with respect to the target member when a release step releasing the mold from the adhesive resin ends is larger than a speed of the mold with respect to the target member at an instant of separation when the mold separates from the adhesive resin.

* * * * *